United States Patent [19]

Boccali et al.

[11] 4,319,193

[45] Mar. 9, 1982

[54] TESTING OF RELAYS AND SIMILAR DEVICES

[75] Inventors: Filbert J. Boccali, St. Mathias; Eric J. Crompton; Ivo Machan, both of Montreal, all of Canada

[73] Assignee: Northern Telecom Limited, Montreal, Canada

[21] Appl. No.: 149,838

[22] Filed: May 14, 1980

[51] Int. Cl.³ ............................................ G01R 31/02
[52] U.S. Cl. ..................................... 324/418; 324/423
[58] Field of Search ................ 324/415, 418, 423, 424

[56] References Cited

U.S. PATENT DOCUMENTS

| 3,355,659 | 11/1967 | Burgess | 324/418 |
| 3,479,584 | 11/1969 | Casey | 324/418 |
| 3,510,759 | 5/1970 | Nador | 324/423 |
| 4,177,419 | 12/1979 | Fiorentzis | 324/418 |

Primary Examiner—Michael J. Tokar
Attorney, Agent, or Firm—Sidney T. Jelly

[57] ABSTRACT

Relays and similar devices are tested by applying electric power to the coil to actuate the armature, measuring armature travel and comparing the measured travel to a datum to produce a percentage relationship. Datum values for the armature travel required to actuate each contact are connected by this produced percentage relationship to produce new datum values for each contact. The armature travel at actuation of each contact is measured and compared to the new or connected datum values. Output signals are desired for the actuation of each contact indicative of the relationship between actual actuation travel and the new datum values.

25 Claims, 9 Drawing Figures

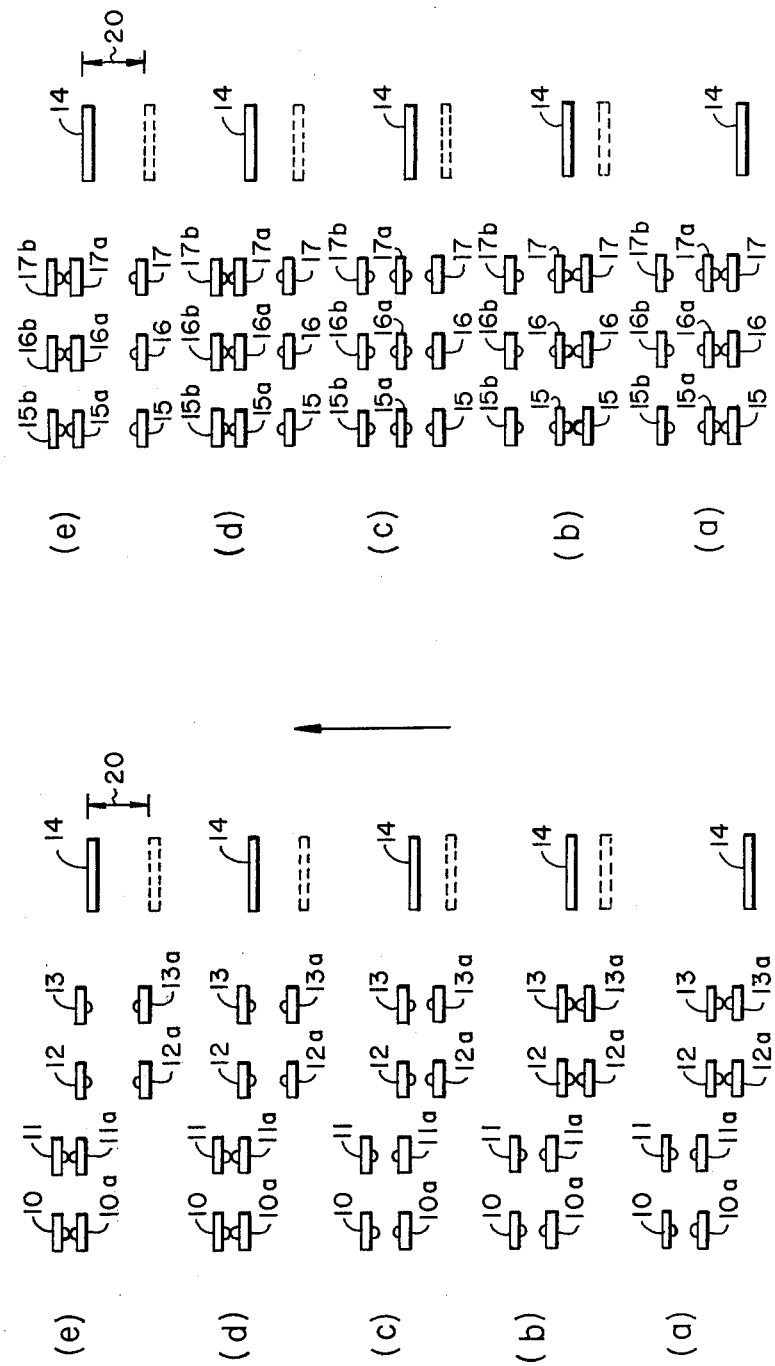

Fig 8

TESTING OF RELAYS AND SIMILAR DEVICES

This invention relates to the testing or relays and similar devices, and is particularly concerned with the testing of relays as are used in telecommunications.

The form of device with which the present invention is concerned is an electrical switch having a plurality of pairs of contacts, the contacts being actuated from one condition to another by the movement of an armature, which in turn is moved by the application of electric power to a coil. The contacts are desired to change their condition in a desired sequence and various forms of such sequence can be provided.

One example is a relay having four pairs of contacts, two pairs being normal made or closed and the other two pairs being normally open or broken when the armature is in the released or unactuated position. It is desired that the two pairs of closed contacts break before the two pairs of open contacts make. In another example there are six pairs of contacts with three normally closed and three normally open, with all closed pairs required to break before the three open pairs make.

Another example is a relay having a plurality of pairs of contacts some pairs normally closed and the others normally open. On operation of the armature it is desired that one pair of normally open contacts make before the normally closed contacts open, with possibly further open pairs of contacts making after the normally closed contacts break.

Various other forms of such devices exist with varying patterns of make and break conditions.

The devices with which the present invention relates are used in very large members, and vary from the large type of relays referred to as "step-by-step" relays as used, and still used, in earlier forms of telecommunications switching. The devices have become smaller and smaller over the years, and are still in use in very large numbers in modern electronic communications systems now being introduced.

Testing of the devices has conventionally been done individually mechanically, by hand labour. The test procedure is to lay down different movement positions of the armature and to sequentially position the armature at these positions and check the condition of the contact pairs. It is determined at what initial travel of the armature no change in condition occurs, then at what travel distance the first condition charge should have occurred but not the second, and finally at what travel distance the second condition change should have occurred. If more than two condition changes are required then the related number of armature travel distances are required to be determined.

To test, the armature is actuated by a voltage applied to the relay coil of a predetermined current, usually larger than the regular current. A first gauge of predetermined thickness is inserted between the core member of the coil and the armature actuated. This gives a position at which no changes should occur. Then a slightly thinner gauge is inserted and the armature again actuated. This gives the armature position at which the first condition change should have occurred and is checked visually. A third thinner gauge gives a position at which the second condition change should have occurred, and again this is checked visually. It is also possible to connect indicators to the contact pairs which will give a lighted indication of condition.

Such test sequences are lengthy and still do not ensure that the device is fully acceptable. For example, there is no indication of what is referred to as "open transfer time", the time between breaking of one pair of group of pairs of contacts and the making of another pair or groups of pairs of contacts. Also it is not possible to detect the amount of "follow through" after a pair of contacts have made. A certain amount of follow through is necessary to ensure that a minimum contact pressure occurs and to allow for wear of contacts. With insufficient open transfer time and/or follow through, the characteristics of a device can alter in service and the device will become faulty.

A specific example of test procedure of one form of relay is as follows:

In the released or de-energized (idle) condition, the relay armature is located at a given distance (dA) away from the core. To ensure reliable static conditions and immunity against external influences (vibration) and future wear, the armature is permitted to travel a minimum distance without affecting the idle state of the make and break contacts. (a) For this purpose a 0.0082" thick gauge is inserted between armature and core and then the relay winding (primary) is energized with a specified current which is usually much larger than the regular operate value to overcome frictional interferences caused by the measuring gauge. The make contacts must stay open and the break contacts must stay closed. (b) The next step requires insertion of a 0.0053" gauge between armature and core and the relay is re-energized. This permits the armature to travel a distance of 0.0029" further from its previous position and thereby closer to the core. The early break contacts now must test open but the make contacts still have to remain open. (c) In the final step, a 0.0024" in gauge is inserted between armature and core to allow the armature to travel another 0.0029" closer to the core. This time the make contacts have to be closed while the break contacts must remain open as before. The remaining 0.0024" (overtravel) of armature travel is designed to ensure for future contact wear during the life of the relay.

It will be seen from the above that up to six possible contact groups have to perform their total operations while the armature traverses a distance of only 0.0082". However the individual contact has to change its state within an armature movement of only 0.0029".

Such small dimensional measurements are not suitable for manual production gauging operations, where speed and accuracy are of prime interest, as they are dependent on the individual operator's skill which varies from person to person.

Measuring errors are introduced by mechanical gauging as follows: (a) Intrusion of a gauge between armature and core forces the heel of the armature away from the yoke when the relay coil is energized, thereby preventing the heel end from rolling around the edge of the yoke in the normal manner. The added friction requires above normal operating currents mentioned earlier. The resultant displacement of the armature pivot point (actually the yoke edge) shifts the operating geometry of the moveable make and break contacts in respect to the fixed contacts which are dimensionally fixed or referenced against the bracket. Any dimensional shift of location by the armature is amplified at the contact end, accordingly increasing the error as seen by a contact monitoring device. (b) The larger than normal operate currents required for the mechanical gauging process tend to give a false sense of security initially where the functioning of relay contacts is concerned, as some relays refuse to operate when subjected to their normal specified operate currents afterwards. This phenomena is prevalent with very small relays due to their more delicate structure.

A quality over which there is no direct control is contact symmetry or contact alignment. It is only possible to adjust contact operations within their respective gauging bands. It is not known if any of the contacts are near the border or limit of the gauging band. This can adversely affect the contact conditions in the later life of the relay.

A further problem can occur due to non-symmetry of the armature legs, which support the contact actuating card, in some relays. This gives non-symmetry of contacts and adds a cantilever type stress to the armature hinge assembly. This affects current flow requirements and adversely affects the operation timing.

Various other problems can exist and can be detected by the present invention, as will be described.

The testing as so far described and as at presently used, assumes certain fixed datum positions, determined by gauges. As relays and the like get smaller, it becomes increasingly difficult to provide such testing. With extremely small, miniaturized versions, as now being used in electronic telephony systems, testing is at least only a rough indication. Further, when such relays are bought from an outside supplier, they are enclosed in a sealed housing and there is no access to the interior for testing. Reliance then has to be placed on the manufacturer's testing, over which there is no control.

Also due to manufacturing tolerances, the actual travel distance of the armature will vary from relay to relay. The armature is normally in contact with a back stop in the de-energized condition and in contact with the core of the coil when energized. This distance varies due to tolerances affecting the back stop contact surface position, the core contact surface position and thickness of the armature. However, in testing, the distances are gauged from the core contact surface and do not take into account possible variations in overall travel distance. This can result in an apparent malfunction of contacts when in fact they could be acceptable.

The present invention is based on the appreciation that contact operating times or positions can be related to the distance, or time, of armature movement; that acceptable parameters can be provided related to the total armature travel (or travel time); and that each relay can be tested to measure or detect actuation of each pair of contacts relative to the armature travel (or travel time). The particular position at which a contact pair is actuated—either to an open or a closed condition, is related to the armature travel (or travel time), being represented as a percentage of such travel (or time). The invention measures the armature travel or travel time of each device as tested, detects the actuation of each contact pair, relates such actuation to such time or travel and checks that the actuation is within the desired range. The invention can be used in its broadest aspect just to accept or reject, but in more specific arrangements can indicate the operating characteristics of each contact pair and also the operational characteristics of the armature.

Either data form can be used as desired, i.e. time of armature travel or distance of armature travel. Optical, or other similar means can be used when actual distances or positions are measured visually, and electrical and electronic means can be used when time is measured rather than distance. In the examples hereinafter described the time of travel of the armature and the time intervals related to contact actuation are measured, electrically, and used to indicate actuating positions along the armature travel. However actual measurement of the actuating positions can be made if desired and used in the same manner, in accordance with the present invention.

A feature of the present invention is that the relays are tested dynamically rather than statically as described above, i.e. using gauges, and this more nearly reproduces the actual operating conditions and thus provides improved and more accurate testing.

In its broadest aspect the invention comprises a method of and apparatus for testing relays and similar devices having a plurality of pairs of contacts actuated by an armature, in which the travel of the armature is detected, the actuation of each pair of contacts detected and related to the armature movement and the parameter of the relationship between contact actuation and armature movement related to a predetermined datum value. Such relationship is determined for each pair of contacts. The device tested can be accepted or rejected. In a specific embodiment, indications are given of the relationships and the position of the relationship within a tolerance band provided. An indication of acceptable armature actuation can also be obtained, plus indication of "open transfer" time and "follow through". The indications can be used to provide a quality control facility and also to provide a feedback to the manufacturing facility to indicate trends in manufacturing.

The invention will be readily understood by the following description, in conjunction with the accompanying drawings, in which:

FIG. 1 is a diagrammatic illustration of sequential movements of armature and contact members for one form of contact member arrangement;

FIG. 2 is a diagrammatic illustration of sequential movements of armature and contact members for another form of contact member arrangement;

FIG. 8 is an example of one printed output which can be obtained, showing operating characteristics of a relay with six sets of break contacts and six sets of make contacts;

Considering first FIG. 1, there is illustrated four pairs of contacts 10, 10a; 11, 11a; 12, 12a and 13, 13a. Also indicated at 14 is a representation of armature position. FIG. 1(a) illustrates the situation or condition when the coil is not energized, that is with the armature unactuated and resting against a back stop (not shown). Normally make or closed contacts 12, 12a and 13, 13a are closed and normally open contacts 10, 10a, 11, 11a are open. In FIG. 1(b) the armature 14 has moved and is about to cause normally closed contacts 12, 12a and 13, 13a to open. The normally open contacts are unaffected.

In FIG. 1(c) the armature 14 has moved to cause the normally closed contacts to break or open while the normally open contacts are still unaffected. In FIG. 1(d) the armature 14 has now moved to close the normally open contacts 10, 10a, 11, 11a. Finally, in FIG. 1(e) the armature has moved full travel to contact the core, giving a follow through action on the now closed contacts 10, 10a; 11, 11a. The originally closed contacts 12, 12a and 13, 13a are still open.

FIG. 2 illustrates an arrangement of three sets of contacts 15, 15a, 15b; 16,16a.16b; and 17, 17a, 17b; with armature also being representatively indicated at 14. One pair of each set of contacts, i.e. 15, 15a; 16, 16a; and 17, 17a are normally closed and one pair of each set of contacts, i.e. 15a, 15b; 16a, 16b; and 17a, 17b are normally open. The sequence is as follows: FIG. 2(a) the armature is at rest on the back stop (not shown); FIG. 2(b) the armature has moved to just start the normally closed contacts to open or break; FIG. 2(c) the armature has moved to open the normally closed contacts and is just starting to cause the normally open contacts to move to a closed condition; FIG. 2(d) the armature has moved to cause the normally open contacts to be closed or made; FIG. 2(e) the armature moves to contact the core, giving follow through for the now closed contacts.

In both FIG. 1 and FIG. 2, the armature travel is indicated at 20.

Figure 3:
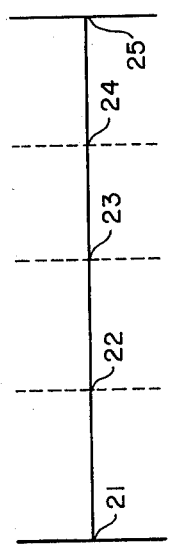
FIG. 3 is a diagrammatic representation of various stages of actuation relative to the overall armature movement, for a contact member arrangement as in FIG. 1.

FIG. 3 is a linear representation of the armature travel with indication of particular actuation positions thereon. In FIG. 3 position 21 corresponds to the position of the armature 14 in FIG. 1(a), position 22 corresponds to armature position in FIG. 1(b), position 23 corresponds to armature position in FIG. 1(c), position 24 corresponds to armature position in FIG. 1(d) and position 25 corresponds to the final position of the armature, as in FIG. 1(e). Thus at position 22 normally closed contacts 12, 12a and 13, 13a are about to break or open, at 23 all contacts are open, while at 24 the normally open contacts 10, 10a and 11, 11a are just made or closed. There is required to be a minimum period, represented by a distance of travel of the armature, between opening of the closed contacts and closing of the open contacts—previously referred to as the open transfer time. For manufacturing reasons, tolerances exist for the first contact change, i.e. the closed contacts opening, and for the second contact change, i.e. the open contacts closing.

No attempt has been made, in FIG. 3, to give actual positions for actuation of contacts, as represented by positions 22, 23 and 24, this Figure being purely diagrammatic only to illustrate the various positions to be measured, or indicated during testing. It should also be realized that the representation in FIG. 3 is likely to be exceptional in that, due to manufacturing tolerances, slight misalignments and the armature being slightly twisted, actuation of contacts can vary. Thus, taking the example of FIG. 1, any or all of the above inaccuracies can result in the pairs of contacts 12, 12a and 13, 13a breaking at slightly different times. Similarly pairs of contacts 10, 10a and 11, 11a may make at different times. Provided such variations of making and breaking occur within the overall tolerances, which will be described in conjunction with FIGS. 4 and 5, then the relay is acceptable. Such variations in make and break can also occur for the arrangement of FIG. 2.

Again, because of manufacturing tolerances, the armature travel or movement may vary from the desired datum, the travel being either shorter or longer. Provided the various actuating positions occur at proportionally correct relationships, the relays can be accepted. It is the appreciation of this relationship and the ability of the test apparatus to adjust the testing parameters for variation in armature movement which is the important feature of the present invention.

Thus, considering FIG. 3 with conventional testing, with gauges, the positions 22, 23 and 24 can readily be determined but this is irrespective of the actual armature travel which can vary from relay to relay. The position 25 can vary but this is not ascertained in conventional testing. If a shorter distance of armature travel occurs this can affect the contact actuation and with present contact actuation testing many of such relays are either rejected or corrective work carried out. The present invention is based on the appreciation that the positions 22, 23 and 24 in FIG. 3 and also position 25, need not be fixed but can be related as percentages of armature travel. Thus positions 22, 23 and 24 will move as position 25 moves. However this cannot be readily tested with present testing techniques.

Figure 5:
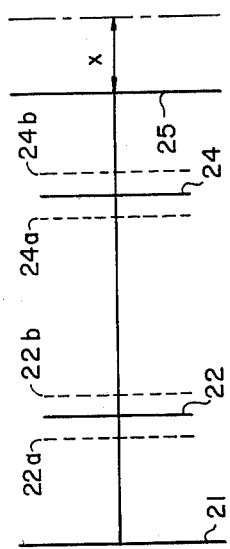
FIG. 5 is an illustration similar to that of FIG. 4, for a sequence with a reduced armature movement.
Figure 4:
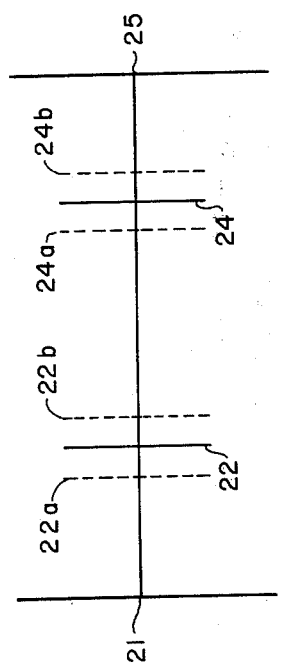
FIG. 4 is a diagrammatic illustration of a typical break and make sequence, related to armature travel, or time, for a configuration as in FIG. 1, showing typical tolerances.

FIGS. 4 and 5 illustrate the operation of two relays with different operating characteristics, FIG. 4 conveniently illustrating an ideal relay in which armature travel and breaking and making all occur at the design positions or proportions of armature travel. Thus the positions 21, 22, 24 and 25 as in FIG. 3 are indicated. Also indicated on FIG. 4 are the tolerances for positions 22 and 24, at 22a and 22b and 24a and 24b respectively. Assuming a relay as illustrated in FIG. 1, the contacts 12, 12a and 13, 13a should open or break at some position between the tolerance limits 22a, 22b and the contacts 10, 10a and 11, 11a should make, or close, at some positions between limits 24a, 24b. FIG. 5 illustrates a situation in which the armature travel is less than design datum. Thus the armature movement or travel is reduced by the amount X. If such a relay was to be tested as previously, as described above, with gauges, the position 24 would be gauged at the position as in FIG. 4. However, with the reduced armature travel this would appear to be too close to the actual position 25. What is actually required is that the positions 22 and 24 be adjusted to conform with the reduced armature movement. Thus if the distance X is stated as a percentage of the design armature travel, then the positions 22 and 24 are adjusted by the same percentage. That is, the distance between positions 21 and 22 in FIG. 5 is that percentage less than the distance between positions 21 and 22 in FIG. 4. Similar adjustment is made to the distance between positions 22 and 24 in FIG. 5 as compared with this distance in FIG. 4. Further, the tolerances are similarly reduced, that is the distances between 22a and 22b and between 24a and 24b are reduced relative to these distances in FIG. 4. It is obvious that it is impossible, as a practical exercise, to provide all the necessary gauges for the various distances, in sets to cater for differing armature travel or movement. In addition to checking that actuation of the contacts occurs at correct positions, it is also desirable to know the total armature movement or travel, the actual distance between the last break or any of the normally closed or made contacts and the first make of any of the normally open contacts—referred to as the open transfer distance. Further, it is desirable to know the distance from the zero position of the armature and the first break of a pair of contacts and also the distance between the last make and the end of travel of the armature—referred to as follow-through.

There are therefore quite a large number of positions which it is desirable to know but which can only be guessed at, or estimated, with the static testing with gauges. With the present invention all of the various positions, and their relationship to one another, can readily be ascertained, with both an indication and a record if desired. It has been found that rejection of relays or the amount of corrective work carried out on relays is considerably reduced. Relays often appearing faulty with the original method of testing were in fact operating correctly, but it was not possible to know this. A further advantage is that relays bought from outside sources sealed into casings, can be tested whereas it is not possible to test them with a gauge system.

Figure 6:
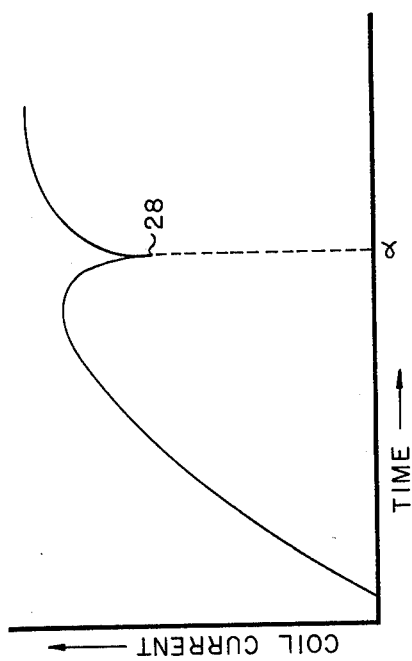
FIG. 6 is one example of the electric current curve of the coil related to armature travel.

It has been noted that the coil current rises from zero to a maximum with time, with a distinct dip at the time the armature contacts the core. FIG. 6 illustrates a typical curve of coil current with time, and at 28 is the distinct dip which represents contact between armature and core. This represents an armature travel time of $\alpha$ which is also representative of armature travel. In the present invention, a relay is plugged into a holder with electrical connections to each contact member and to the coil, with monitoring means attached to the holder such that the position 28 is detected and also the break and make positions of each pair of contacts. The situation as illustrated in FIGS. 1 and 2, and also in FIGS. 3, 4 and 5 is idealistic, as described previously, in that all closed contacts do not necessarily open at the same time, nor do all the normally open contacts close at the same time. With the present invention, the breaking or opening and making or closing of every contact pair is detected.

Thus there is now provided a measure of the armature travel time and the time of each opening and closing of contacts. These contact actuation times can be compared with armature travel time and if within allowable tolerances of predetermined percentages of armature travel time then the relay is acceptable. For convenience the time is used as a means for indicating contacts and armature actuation, as simple electrical detection means can be used. With other detection means, e.g. optical, the actual distances can be monitored. However, for test purposes, correlation between time and distance is very high.

The particular percentages can be determined from initial design, or acceptable values determined from initial testing and inspection of early manufactured relays. Acceptable tolerances are also determined and these percentages and tolerances provide a basic datum. Various ways of comparing the actual contact actuation times with the actual armature travel time can be applied. For each relay, after determination of the armature travel time, the actual desired datum contact actuation can be ascertained.

The necessary calculations for the adjustment of the various positions can be carried out in various ways. Thus the time $\alpha$ in FIG. 6 can be obtained by means of a visual display such as a CRT. The scale on the display can have an indication of the design value for $\alpha$ and the percentage difference between design $\alpha$ and actual $\alpha$ can be calculated. The actual value for $\alpha$ can be larger or smaller than the design value. Appropriate recalculation of the various datum for contact make and break, and tolerances can then be made. This is extremely tedious if done by normal calculator or the like. An advance on this is to supply the information to suitable electrical circuitry of a conventional "hard wired" form, but this is expensive, rather large, and not readily adaptable to different forms of relays.

The preferred way of making the adjustments to the datum is by using a micro-computer or similar device. Such devices can readily be programmed to carry out the calculations quickly and accurately and can be easily adapted to test various forms of relays by the operator merely selecting the appropriate programme.

Figure 7:
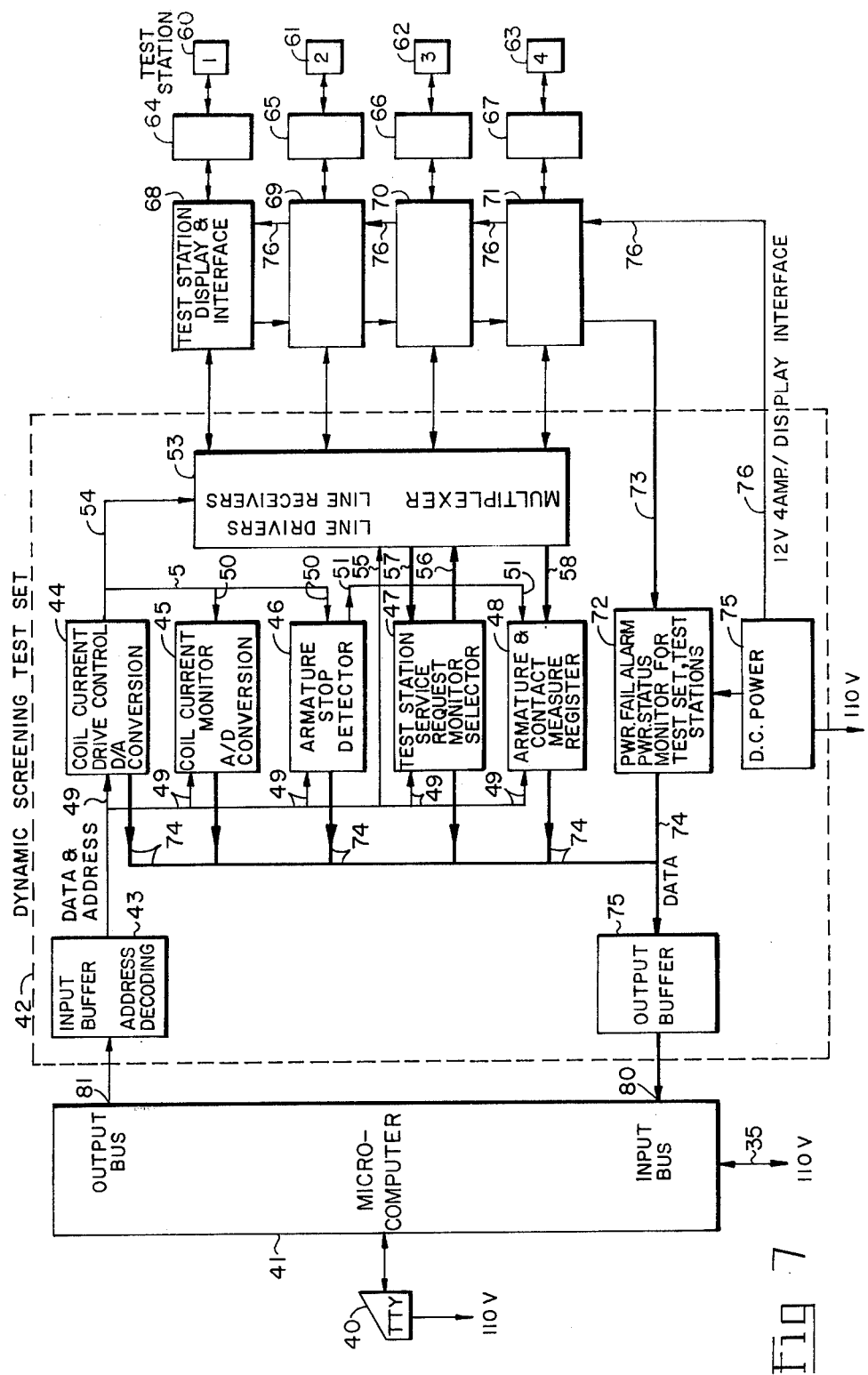
FIG. 7 is a block diagram illustrating one form of apparatus for testing relays at four test stations.

FIG. 7 is a diagrammatic representation or diagram of one form of test apparatus. The apparatus, in the example illustrated, comprises a typewriter/printer 40 connected to a microcomputor 41, in the present instance a PDP11-V03 microcomputor by Digital Equipment Company Ltd., which in turn is connected to the dynamic screening test set indicated by the dotted outline 42.

The screening test set comprises an input buffer 43 and address decoding, fed from the microcomputer output bus 81, the buffer feeding to a plurality of items: coil current drive control and digital to analogue converter 44; a coil current monitor and analogue to digital converter 45; an armature stop detector 46; a test station service request monitor and test station select control 47; and an armature and contact measure register (clock) 48; by conductors 49.

Coil current drive control 44 is connected to the coil current monitor 45 and armature stop detector 46 by conductor 50. The armature stop detector 46 is connected to the armature and contact measure register 48 via conductor 51.

A connection also extends from the coil current drive control 44 to a multiplexer 53 with line drivers and line receivers via conductor 54, while a direct connection from the input buffer 43 is made to the multiplexer 53 via conductor 49 and conductor 55, a connection is made from the test station service request monitor 47 to the multiplexer 53 by conductor 56 and connections are made from the multiplexer 52 to the test station service request monitor 47 and armature and contact measure register 48 via conductors 57 and 58 respectively.

In the example illustrated, four test stations 60, 61, 62 and 63 are provided, each test station interconnected, via break down control and isolation devices 64 to 67 and test station displays and interfaces 68 to 71 respectively to the multiplexer 53, as illustrated, with the test station display and interfaces also being interconnected. From the test station displays and interfaces 68-71 a connection extends, via a power failure alarm and status monitor 72, via conductor 73, monitor 72 also being connected to the various items 44 to 48 via conductors 74, and also to an output buffer 75. Output buffer is connected to the input bus of the microcomputer 41.

A power supply 75 is connected to the power failure alarm and status monitor 72 and also to the test station displays and interfaces via conductor 76.

The break down control and isolation devices 64 to 67 need not be provided. These devices provide for high voltage breakdown testing of relays. In the example illustrated such testing is done under the control of the microcomputer 81, but prior to actual test the sensitive parts of the test apparatus, that is the dynamic screening test set within the dotted outline 42, are electrically isolated. The high voltage breakdown test can be done on another apparatus and then the devices 64 to 67 would not be required.

The various different items are themselves standard forms of devices used in various ways in electrical and electronic circuits. While particular interconnections and the like are made for the specific purpose of the present invention, this is within the skill of an ordinary person working in the art.

In the example four test stations 60 to 63 are shown, but the number can vary. The test apparatus works on a time sharing basis, the test sets selectively connected in random turn, on a first come first served basis, to the coil current drive 44 and to the armature and contact measure register 48.

The typewriter 40 can be used to input to the microcomputer 41 to set up programmes for the different forms of relays to be tested and also to produce a printed output of the actuation characteristics of each relay tested, if desired. Also a print out can be obtained of the summation of the operating characteristics of all relays of a type tested for a particular period, e.g. a day, a workshift or other. However the typewriter need not be a part of the test apparatus.

The system works as follows, the apparatus switched on and power supplied at 35. Relays are inserted in sockets in the test stations 60 to 63 by the operator or operators. The state of readiness of a test station is passed to the multiplexer 53 and thence to the test station service request monitor and station select control 47. The control 47 selects a test station which is ready and instructs the multiplexer 53 to connect that station to the system. Generally the selection by the multiplexer is on a first come basis, it being appreciated that it is unlikely that all test stations would be at readiness at exactly the same time. Even if this did occur, a random selection would be made.

On connection of a test station, power is applied to the coil of the relay, via the appropriate interface 68–71. The coil current is monitored at a constant value by the drive control 44. At the same time the clock or counter in the register 48 is started. As the contacts make or break, pulses are received by the register 48, the various intervals being counted therein. When the armature contacts the core, the dip in the coil current, 28 in FIG. 6, is detected at detector 46 and the clock or counter in register 48 stopped. The data collected by the register is sent via the output buffer 75 to the input bus 80 of the microcomputer 41.

The microcomputer compares the actual time of travel of the armature, which corresponds to the distance of travel, with the preset datum value and produces a proportional value which it applies to the various datum values. Thus, as an example, if the time of travel of the armature is 10% less than datum then it applies a 10% reduction to the remaining datum, that is the positions 22 and 24 and also to the tolerances 22a, 22b and 24a, 24b. This would happen for the situation in FIG. 5, for example, if the value for X was 10%. Further, the microcomputer ensures that the time (i.e. travel or distance) between the new values or positions for 22b and 24a is above a minimum, and that the time (i.e. travel or distance) between 24b and 25 is also above a minimum, and that the overall travel of the armature is above a minimum.

An output from the microcomputer is fed from the output bus 81 of the computer 41, via input buffer 43 and conductor 55 to the multiplexer 53 and thence to the display of the test station display and interface 68–71 associated with the particular test station connected to the system. The operator at the test station sees an indication, for example a light, for each value tested, i.e. making and breaking of contacts and armature travel, if such value is within requirements. If any value is outside limits no indication is given. In some instances, such as in sealed relays, any relay in which no indication occurs for any one or more values is scrapped. In other relays it is possible to do remedial work on the particular item concerned and retest.

A similar situation exists where the armature travel exceeds the datum, then the various values are adjusted with checks to see that the travel is not above a maximum value, that the transfer time is not too long and the follow through time not too long.

In addition to a display at the related test station, a display can also be provided at some other position, for example at an assembly and/or production stage. This enables a constant watch to be maintained and any trends in variation of manufacture detected and rectified before such variations result in relays which are outside the specification. Thus the system can be used as a quality control device. Further, as previously mentioned, a constant print-out can be provided, and also, on request, a summarization of results for any desired period.

Figure 8:
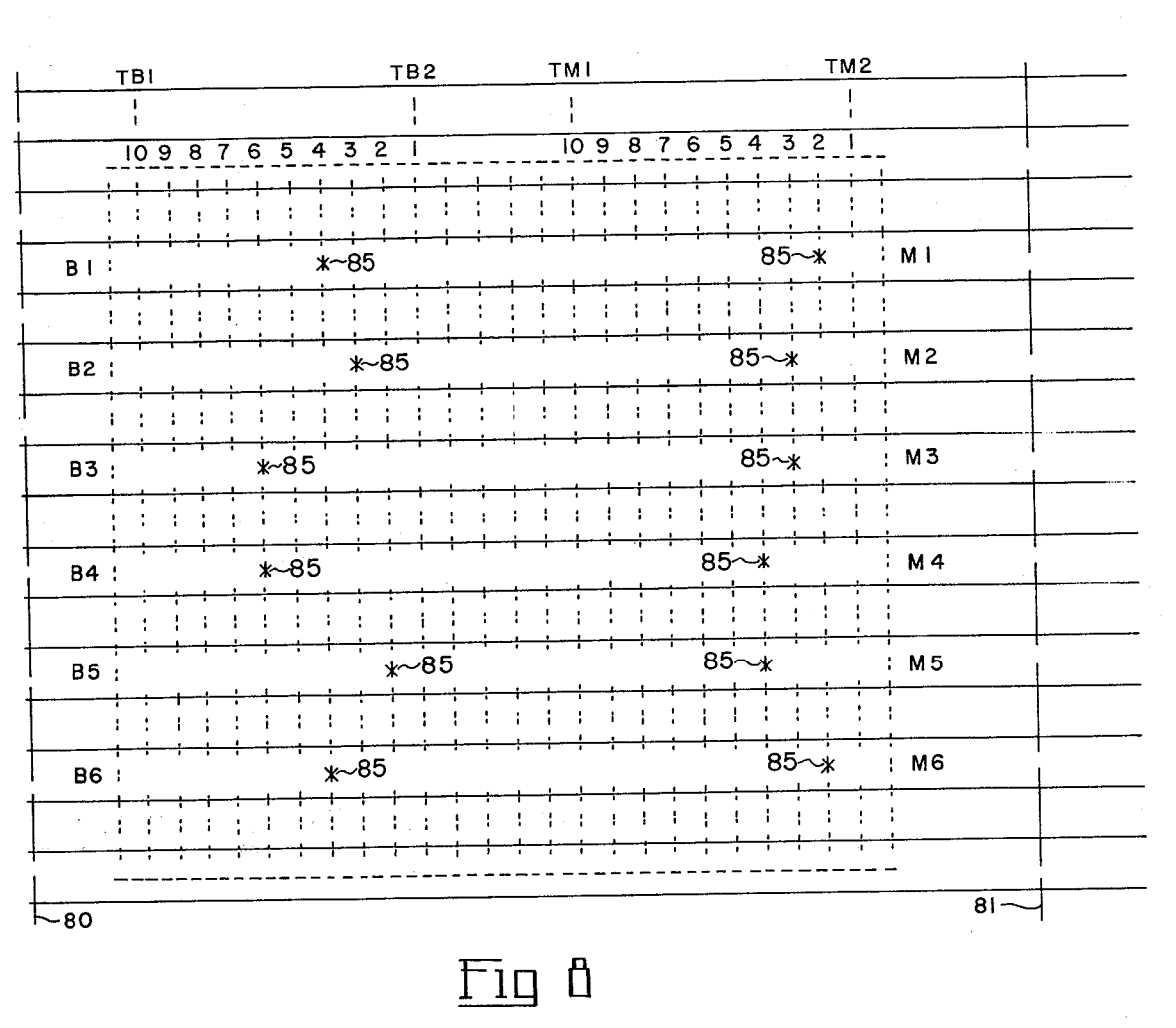

FIG. 8 is a typical print out, at the typewriter 40, of the results of testing a relay. This particular relay had six break contacts, indicated by B1 to B6 and six make contacts M1 to M6. The dotted line 80 corresponds to positions 21 in FIGS. 4 and 5 and dotted line 81 corresponds to position 25 in FIGS. 4 and 5. The positions designated TB1 and TB2 in FIG. 8 correspond to 22a and 22b in FIGS. 4 and 5, and positions TM1 and TM2 correspond to 24a and 24b.

The distance between TB2 and TM1 is the minimum open transfer time and the distances between 80 and TB1 and TM2 and 81 the minimum follow-through. The actual break and make positions for the various contacts are indicated at 85. The distances between TB1 and TB2 and between TM1 and TM2 are, for convenience divided into ten parts for case of identifying actual distances. The display at the test station, or elsewhere, can take a similar form, that is a lighted display with indicator lamps at each subdivision 1 to 10 of the distance TB1–TB2 and TM1–TM2. The indication will be to the nearest subdivision.

For convenience of a standard display, where the microcomputer 41 takes the actual armature travel distance or time and compares thus with the datum, to determine the connection factor to be applied to the positions 22 and 24, and the tolerances 22a, 22b and 24a, 24b, then such distances or times are rectified or modified so as to relate them to the display characteristics. That is, assumming that the armature travel time or distance is 90% of datum, then initially the computer modifies all other datum values to 90% and makes the test for correct operation of the relay. For display purposes the computer takes the actual distances or lines and increases them such that the armature travel corresponds to 100%. Approximately this means that all detected and measured times or distances are increased by approximately 11% so that a standard display can be used. If this is not done then the display itself will need to be modified for each test. This can be provided by for example, a CRT on to which a grid is imposed electronically, the grid being modified for each relay as it is tested and the make and break positions of the contacts also indicated thereon. As a minimum it is not even necessary to provide a display which indicates the various make and break positions of each contact but more provide a go/no go form of indicator or display which indicates whether or not all the characteristics or parameters are within specification. This latter form of display or indication is likely to be satisfactory for testing sealed or enclosed relays as rectification work cannot normally be carried out on such relays.

However, many relays are amenable to rectification and with a full display—such as illustrated in FIG. 8, if one, or more, contacts are outside limits for actuation, such contacts can often be manually altered so as to be within limits. In such an instance, after working on the relay, it would normally be retested.

Figure 9:
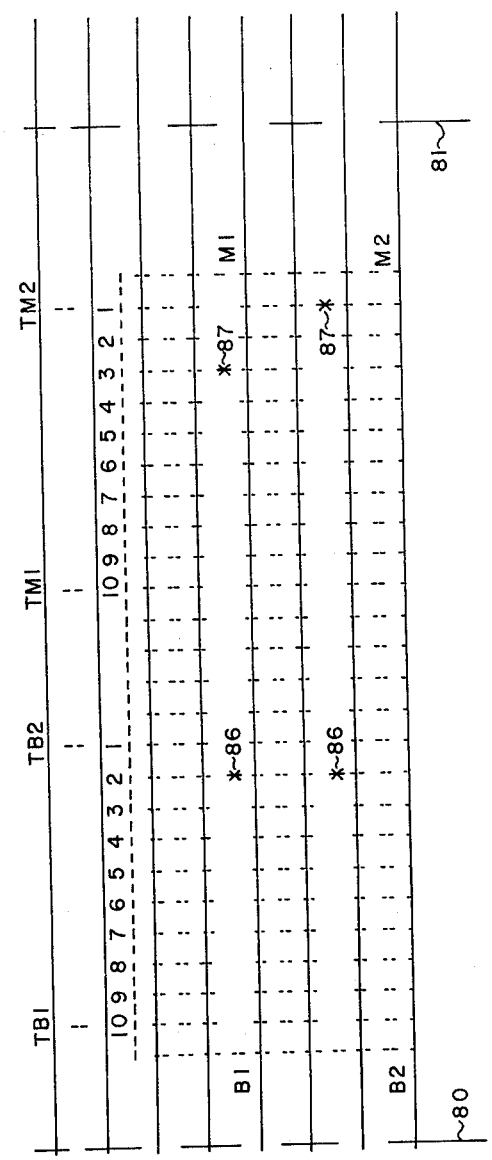
FIG. 9 is an example of a printed output for two break and two make contacts.

FIG. 9 illustrates a display, or print-out for a relay with two break and two make contacts, in which it will be seen that the break contacts B1 and B2 are breaking very near to the limit TB2 at 86. The first make contact M1 is making fairly close to the limit TM2, at 87, but the second make contact M2 is making right on the limit TM2, at 88. This would not be considered as very satisfactory and steps would be taken, if this was possible, to correct manufacturing procedures to move the position 88 away from position TM2. If the relay was one which could be rectified, the operator would bend the contact member of M2 to provide slightly earlier making.

What is claimed is:

1. Apparatus for testing relays and similar devices having a core, a coil on said core, an armature actuated by said core and coil, and a plurality of contacts actuated by movement of said armature, said apparatus comprising:
    at least one test station including a socket for reception of terminal pins of the device to be tested;
    means for applying electrical power to the coil of the relay;
    means for measuring the travel of the armature;
    means for comparing said travel with a datum value for said travel and producing a percentage relationship with said datum value;
    means for applying said percentage relationship to predetermined datum values for actuation of each said contacts by said armature travel, said datum values relates to armature travel, to produce new datum values;
    means for detecting actuation of each said contacts during armature travel and related thereto and comparing armature travel for each contact with said new datum values;
    means for producing a signal indicative of the relationship between armature travel for each contact and said new datum values.

2. Apparatus as claimed in claim 1, including a plurality of test stations, and means for selecting a station for connection of said electrical power to said selected station.

3. Apparatus as claimed in claim 2, said means for selecting a station including means for detecting a station having a device inserted therein.

4. Apparatus as claimed in claim 1, including a visual display, and means for connecting said signals indicative of the relationship of said armature travel to said datum values, to said visual display.

5. Apparatus as claimed in claim 4, including a plurality of light emitting devices, said signals resulting in a lighted indication if said relationship is within predetermined limits.

6. Apparatus as claimed in claim 1, including means for providing a signal indicative of said armature travel.

7. Apparatus as claimed in claim 6, including means for producing a visual signal if said armature travel is within predetermined limits.

8. Apparatus as claimed in claim 1, including means for inputting a signal to select said predetermined datum values for actuation of said contacts and said datum for travel of said armature.

9. Apparatus as claimed in claim 1, including means for recording said signals indicative of the relationship between armature travel for each contact and the new datum values, and means for producing a printed display of such recording.

10. Apparatus for testing relays and similar devices having a coil, a coil on said core, and an armature actuated by said core comprising:
    at least one test station, said test station including a socket for reception of terminal pins of a device;
    means for applying electrical power to the coil of the device;
    means for detecting a current dip in the power supply to said device, said dip being indicative of contact between armature and the core;
    means for measuring the time period between initial connection of power to said coil and said dip;
    means for comparing said time period with a predetermined value and producing a percentage relationship with said predetermined value;
    means for applying said percentage relationship to predetermined datum values for actuation of contacts of said relay to produce connected datum values;
    means for measuring actuating times of said contacts relative to the initial connection of power to said coil;
    means for comparing said actuating times of said contacts with said connected datum values after application of said percentage relationship;
    means for providing a signal indicative of the relationship of each of said measured times to a related said connected datum values.

11. Apparatus as claimed in claim 10, including a plurality of test stations and means for selecting a station for connection of said electrical power to the selected station.

12. Apparatus as claimed in claim 11, said means for selecting a station including means for detecting a station having a device inserted therein.

13. Apparatus as claimed in claim 10, including a visual display, and means for connecting said signals indicative of the relationship of said measured times to said datum values, to said visual display.

14. Apparatus as claimed in claim 13, including a plurality of light emitting devices, said signals resulting in a lighted indication if said relationship is within predetermined limits.

15. Apparatus as claimed in claim 10, including means for providing a signal indicative of said time period between initial connection of power to said coil and said dip.

16. Apparatus as claimed in claim 15, including means for producing a visual signal if said time period between initial connection of power and said dip is within predetermined limits.

17. Apparatus as claimed in claim 10, including means for inputting a signal to select said predetermined value and said predetermined datum values.

18. Apparatus as claimed in claim 10, including means for recording said signals indicative of the relationship of said measured times to said connected datum values.

19. A method of testing relays and similar devices having a core, a coil on said core, an armature actuated by said core and coil, and a plurality of contacts actuted by movement of said armature, comprising:

applying electric power to said coil to move said armature;

detecting the travel of the armature and producing a signal indicative of armature travel;

comparing said signal with a predetermined datum value for said travel and producing a percentage relationship to said predetermined datum value;

applying said percentage relationship to predetermined datum values relating to actuation of each of said contacts by said armature at at least one position during said travel and producing new datum values;

determining the actuation of each of said contacts in relation to said travel of said armature and comparing said actuation of each of said contacts with said new datum values;

producing a signal indicative of the relationship between said actuation and said new datum value for each contact.

20. A method as claimed in claim 19, including providing a plurality of test stations, inserting said devices in said test stations, and selecting a station for application of said electric power.

21. A method as claimed in claim 19, including providing a visual display, connecting said signal indicative of the relationship between said actuation and said new datum value for each contact to said display for visual indication thereof.

22. A method as claimed in claim 19, including producing a signal indicative of the armature travel.

23. A method as claimed in claim 21, including producing a signal indicative of the armature travel and connecting said signal to said visual display.

24. A method as claimed in claim 19, including inputting a signal to select said predetermined datum value for armature travel and said predetermined values for actuation of said contacts.

25. A method as claimed in claim 19, including recording said signals indicative of the relationship between said actuation and said new datum value for each contact.

* * * * *